United States Patent
Zuniga-Ortiz et al.

(10) Patent No.: US 7,910,471 B2
(45) Date of Patent: Mar. 22, 2011

(54) BUMPLESS WAFER SCALE DEVICE AND BOARD ASSEMBLY

(75) Inventors: Edgar R. Zuniga-Ortiz, McKinney, TX (US); Sreenivasan K. Koduri, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1335 days.

(21) Appl. No.: 10/769,699

(22) Filed: Feb. 2, 2004

(65) Prior Publication Data
US 2005/0167826 A1    Aug. 4, 2005

(51) Int. Cl.
*H01L 21/44* (2006.01)

(52) U.S. Cl. .......... 438/612; 438/613; 257/E21.508

(58) Field of Classification Search .......... 438/118, 438/612, 613, 614, 617, 116; 257/E21.508
See application file for complete search history.

(56) References Cited

U.S. PATENT DOCUMENTS

| | | | |
|---|---|---|---|
| 3,737,380 A | 6/1973 | Bachmeier | 204/15 |
| 4,000,842 A | 1/1977 | Burns | 228/180 |
| 5,059,553 A | 10/1991 | Berndlmaier et al. | 437/183 |
| 5,249,728 A | 10/1993 | Lam | 228/111 |
| 5,367,195 A | 11/1994 | DiGiacomo et al. | 257/767 |
| 5,872,404 A | 2/1999 | Lynch et al. | 257/781 |
| 5,943,597 A | 8/1999 | Kleffner et al. | 438/613 |
| 6,177,731 B1 | 1/2001 | Ishida et al. | 257/780 |
| 6,348,730 B1 | 2/2002 | Yi et al. | 257/737 |
| 6,492,197 B1 | 12/2002 | Rinne | 438/108 |
| 6,501,185 B1 | 12/2002 | Chow et al. | 257/780 |
| 6,614,113 B2 | 9/2003 | Watanabe et al. | 257/750 |
| 6,617,687 B2 * | 9/2003 | Akram et al. | 257/737 |
| 6,617,696 B1 | 9/2003 | Bendal | 257/780 |
| 6,709,901 B1 * | 3/2004 | Yamazaki et al. | 438/149 |
| 6,798,050 B1 * | 9/2004 | Homma et al. | 257/678 |
| 2001/0033020 A1 | 10/2001 | Stierman et al. | 257/737 |

FOREIGN PATENT DOCUMENTS
JP    62144346    8/1987

* cited by examiner

*Primary Examiner* — Hoai v Pham
(74) *Attorney, Agent, or Firm* — Wade J. Brady III; Frederick J. Telecky, Jr.

(57) ABSTRACT

A semiconductor chip having a planar active surface including an integrated circuit; the circuit has metallization patterns including a plurality of contact pads. Each of these contact pads has an added conductive layer on the circuit metallization. This added layer has a conformal surface adjacent the chip and a planar outer surface, and this outer surface is suitable to form metallurgical bonds without melting. The chip contact pads may have a distribution such that an area portion of the active chip surface is available for attaching a thermally conductive plate; this plate has a thickness compatible with the thickness of the conductive pad layer.

6 Claims, 3 Drawing Sheets

BUMPLESS WAFER SCALE DEVICE AND BOARD ASSEMBLY

FIELD OF THE INVENTION

The present invention is related in general to the field of electronic systems and semiconductor devices, and more specifically to structure and fabrication methods of wafer-scale devices and their assembly onto wiring boards.

DESCRIPTION OF THE RELATED ART

In their book "Chip Scale Package" (McGraw-Hill, 1999), John H. Lau and Shi-Wei Ricky Lee describe various semiconductor devices and packages of contemporary "chip-scale" families, as they are fabricated by a number of semiconductor companies worldwide. The newest designs and concepts in microelectronics assembly and packaging are aiming for a package with a planar area not substantially greater than the silicon chip itself, or at most 20% larger area. This concept, known as Chip-Scale Package (CSP), is finding particular favor with those electronics industries where the product size is continually shrinking such as cellular communications, pagers, hard disk drivers, laptop computers and medical instrumentation. Most CSP approaches are based on flip-chip assembly with solder bumps or solder balls on the exterior of the package, to interface with system or wiring boards.

A typical flip-chip process calls for solder-compatible contact pads on the circuit surface of the chip, and the deposition of solder bumps or balls thereon. The semiconductor wafers have to be separated into chips before flip-chip attachment to the board. Existing solder bump processes include solder through metal masks, electroplated solder or screen printing a mound of solder paste onto each metallic contact. Typically the solder bumps are reflowed in a chain type furnace. Alternatively, pre-fabricated solder balls may be placed on the chip pads and reflowed in a similar chain type furnace.

The chip-to-be-flipped may then be attached to a second interconnection surface such as an interposer, or alternatively, coupled directly to a printed circuit board (PCB). Attaching the flip-chip to the next interconnect is carried out by aligning the solder bumps or balls on the chip to contact pads on the second level interconnection and then performing a second solder reflow operation. During the reflow, the bumps or balls liquefy and make a bond to the next interconnect level which has pads or traces to receive the solder. Following the solder reflow step, flip-chips often use a polymeric underfill between the chip and the interposer or PCB to alleviate mechanical stress caused by the mismatch in the coefficients of thermal expansion (CTE) between the semiconductor chip, the interposer, if any, and the PCB. Many reliability problems occur due to the stress placed on the solder bumps or balls when the integrated circuit is cycled from hot to cool during operation. The interposers and underfills of the prior art are used to reduce or eliminate the mechanical stress generated by thermal cycling on the solder bumps or balls, but they help little to dissipate thermal energy.

When another set of solder balls on the opposite side of the interposer is employed to complete the bonding process to a PCB, this second set may also be aligned and reflowed for attachment by the end user. When the chip is attached to the board as described, the final consumption of board area is usually not much larger than the area of the chip (about 20% larger). Consequently, this family of products is classified as "chip-scale packages". However, these devices contribute little to reduce the device height, which is critical in small appliances.

Problems exist with conventional process equipment and flows for chip-scale packages using flip-chip technology. First, a typical solder bumping process is very equipment intensive, resulting in a large capital cost. Evaporation, plating and screening are environmentally unfriendly in that they make use of excess of solder, often containing lead. Both processing and clean-up costs are high in these operations.

Second, the manufacturing of flip-chip assembly can have a long cycle time. Typically, reflows which are carried out in infrared or forced convection ovens have cycle times of 5 minutes or longer. These furnaces are usually very long (>3 m) and massive structures, occupying much space on the assembly floor. Moving parts in such furnaces are a significant source of particulate contamination.

Third, present day assembly of flip-chips is processed in chip form. The assembly process starts after the chip has been diced from the wafer. This type of production strategy causes a disconnect between the wafer fabrication and test plant ("wafer fab") and the assembly and final test site because the dicing of the wafer must occur outside the clean room environment of a wafer fab. In addition, there are substantial costs in shipping valuable wafers worldwide. After packaging is completed in the assembly sites, the devices must undergo final testing before they can be shipped to the customer. A need thus exists for a packaging method that provides for wafer-scale assembly of integrated circuits, preferably in the clean room facility of the wafer fab itself.

SUMMARY OF THE INVENTION

The present invention describes a semiconductor chip having a planar active surface including an integrated circuit; the circuit has metallization patterns including a plurality of contact pads. Each of these contact pads has an added conductive layer on the circuit metallization. This added layer has a conformal surface adjacent the chip and a planar outer surface, and this outer surface is suitable to form metallurgical bonds without melting. The chip contact pads may have a distribution such that an area portion of the active chip surface is available for attaching a thermally conductive plate; this plate has a thickness compatible with the thickness of the conductive pad layer.

The present invention further discloses several embodiments of semiconductor assemblies in which a chip as described above is bonded to a wiring board which has a plurality of planar, metallurgically bondable terminal pads in a distribution aligned with the distribution of the chip contact pads. The bonding is performed by a technique selected from Direct welding by metallic interdiffusion;
Attaching by solder paste;
Attaching by conductive adhesive.

In the first embodiment, the chip, with or without the heat spreader, is directly bonded to the board. In the second embodiment, the chip, with or without heat spreader, is first attached to a substrate. In the "ball-grid array" version of this embodiment, the substrate comprises solder balls for the attachment to the wiring board. In the "land-grid-array" version of this embodiment, the device comprises bondable pads for the attachment to the wiring board.

In the third embodiment, the chip, with or without heat spreader, is first attached to a relatively thicker metal patterned in the mirror image of the chip contact pads. This thicker metal, in turn, is the directly bonded to the wiring board. For the third embodiment, as well as for the second embodiments, an encapsulation, for example in protective molding compound, of chip and substrate is preferred. This feature, in turn, provides the condition for assembling extra-thin silicon chip material, a welcome contribution for fabricating low-height chip-scale devices.

The first and the third embodiment can be designed and manufactured as true chip-size devices.

It is a technical advantage of the present invention that a wide variety of materials and techniques can be employed for the proposed metallization and assembly steps.

Other technical advantages of the present invention include a reduction of manufacturing cost, a lead-free assembly solution, improved thermal performance of the package, and improved reliability of the device.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 09/458,593, filed on Dec. 10, 1999 (Zuniga et al., "Bonding over Integrated Circuits"), which is herewith incorporated by reference.

Figure 1:
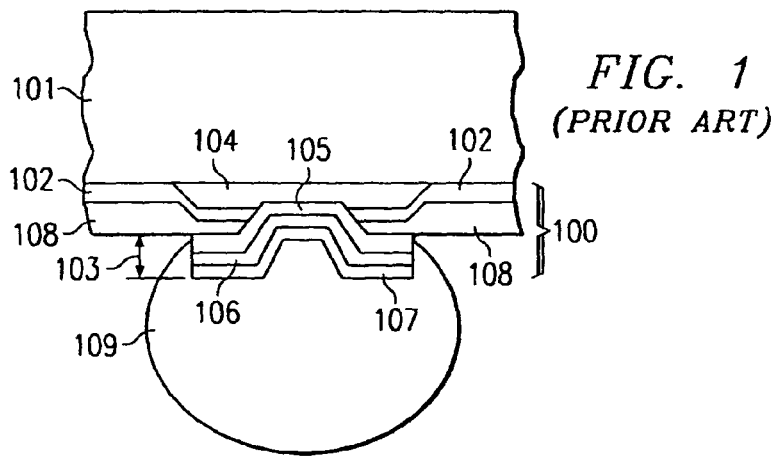
FIG. 1 is a schematic cross section of an IC contact pad having under-bump metallization and a solder ball for flip-chip attachment according to known technology.

The impact of the present invention can be most easily appreciated by highlighting the shortcomings of the known technology. As a typical example of the known technology, the schematic cross section of FIG. 1 illustrates the detail of the metallurgical requirements for the integrated circuit contact pad 100 in order to ready it for flip-chip assembly using solder balls. A semiconductor chip 101, commonly silicon, is protected by a dielectric protective overcoat 102, usually silicon nitride, and a patterned metallization "under-bump" 103 over the aluminum or copper 104 of the circuit contact pads. Metallization 103 usually consists of a sequence of thin layers: When the circuit metallization 104 is aluminum, the conformal layer 105 adjacent to the circuit is typically a refractory metal 105, such as chromium, titanium, tungsten, molybdenum, tantalum, or alloys thereof. When the circuit metallization 104 is copper, the conformal layer 105 is typically aluminum. The following buffer layer 106 is typically nickel. The outermost layer 107 has to be a solderable metal, such as gold, copper, nickel, or palladium.

Finally, solder bump 109 is formed by reflowing the deposited (evaporated or plated) solder alloy (typically a mixture of tin and lead, indium, or other metals). These solder bumps assume various shapes after attaching the chip to the substrate, influenced by the forces of surface tension during the reflow process. The overall process depicted in FIG. 1 is expensive, since typically ten or more process steps are involved: Sputter chromium and copper (or nickel or any of a wide selection of metals described in the literature); spin resist; bake; expose; develop; etch metal; remove resist; seed solder; evaporate or plate solder; reflow solder; flip-chip attach.

In some process flows of the known technology, a layer 108 of polymeric material (benzocyclobutene, BCB) is deposited over the silicon nitride layer 102 so that it can act as a stress-relieving buffer between the under-bump metal 103 and the solder material 109. It has been shown to be useful in preventing solder joint failures when the solder bump has to withstand thermomechanical stresses in temperature variations.

The bumped chip is then flipped so that its surface having the integrated circuit faces the assembly board, and solder-attached to that board. This assembly lends itself to the fabrication of so-called "chip-size" devices which have the same outline as the chip. Unfortunately, these devices suffer from the drawback that, in operation and temperature excursions, they are sensitive to thermomechanical stress due to the mismatch between the coefficients of thermal expansion of the semiconductor material and the substrate material.

These reliability risks, as well as the requirements for special pad metallizations, have been described in a series of detailed publications by the International Business Machines Corporation in 1969 (IBM J. Res. Develop., Vol. 13, pp. 226-296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controlled Collapse Interconnections, S. Oktay, Parametric Study of Temperature Profiles in Chips Joined by Controlled Collapse Techniques, B. S. Berry et al., Studies of the SLT Chip Terminal Metallurgy.

These investigations of the optimum height and volume of the solder joint and the expected onset of thermal fatigue and cracking showed that it is desirable to have a highly ductile solder;
a high ultimate shear strength of the chip/joint and substrate/joint interfaces;

a large value for the ratio (radius of bump-to-chip contact)/(distance to neutral point of chip).

One method aims at absorbing part of the thermomechanical stress on the solder joints by plastic material surrounding the joints and filling the gap between chip and substrate. See for instance, U.S. Pat. Nos. 6,213,347 and 6,228,680 (Thomas, "Low Stress Method and Apparatus of Underfilling Flip-Chip Electronic Devices"). However, this method is expensive, because it represents an additional process step, and it may not be welcome since the customer may have to perform the process after device attachment to the motherboard.

Another method aims at elongating the solder joint after assembly into a column with concave surface contours. However, this method is constrained by solder volume and manufacturability.

Figure 2:
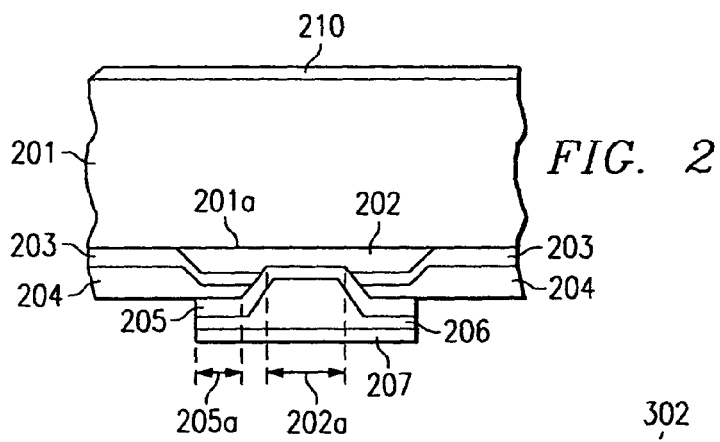
FIG. 2 is a schematic cross section of the first preferred embodiment of the invention, showing an IC contact pad having added conductive layers, the outer layer having a planar surface suitable to form metallurgical bonds.

The schematic cross section of FIG. 2 illustrates the first preferred embodiment of the present invention. 201 is a portion of the semiconductor chip, with planar active surface 201a, including an integrated circuit (IC). The semiconductor material is commonly silicon; other materials include silicon germanium, gallium arsenide, or any other semiconductor material used in IC fabrication. The IC has a metallization pattern 202 including a plurality of contact pads 202a. The chip metallization 202 may consist of aluminum, copper, or alloys thereof. The IC surface is protected by a dielectric protective overcoat 203, usually silicon nitride of about 1 μm thickness. Also shown in FIG. 2 is an optional polymeric overcoat 204, frequently benzocyclobutene (BCB) in the thickness range between 1 to 3 μm. As FIG. 2 illustrates, the photoresist window defining contact pad 202a has been opened through both the protective overcoat 203 and the additional overcoat 204.

When layer 202 is aluminum or aluminum alloyed with 0.5 to 2% copper and/or 0.5 to 1% silicon (layer 0.4 to 1.5 μm thick), the contact pad exhibits under the aluminum frequently a thin layer (4 to 20 nm thick) of titanium, titanium nitride, titanium tungsten, tantalum, tantalum nitride, tantalum silicon nitride, tungsten nitride, or tungsten silicon nitride (not shown in FIG. 2).

For aluminum as well as copper chip metallization, the insulator under the metallization is typically silicon dioxide. However, with the recent trend towards dielectric materials of lower dielectric constants, films made of silicon-containing hydrogen silsesquioxane (HSQ), aerogels, organic polyimides and parylenes are also used in spite of the fact that they are less dense and mechanically weaker than previous standard insulators such as the plasma-enhanced chemical vapor deposited dielectrics. Also, stacks of dielectric layers may be used such as alternating layers of plasma-generated tetraethylorthosilicate (TEOS) oxide and HSQ, or ozone TEOS oxide and HSQ.

In order to strengthen the chip contact pad mechanically, reinforcing structures are sometimes placed under the bonding pad (not shown in FIG. 2). Descriptions may be found in U.S. Pat. No. 6,1443,396, issued Nov. 7, 2000 (Saran et al., System and Method for Reinforcing a Bond Pad), and U.S. Pat. No. 6,232,662, issued May 15, 2001 (Saran, System and Method for Bonding over Active Integrated Circuits), and U.S. patent application Ser. No. 09/312,385, filed May, 14, 1999 (Saran et al., "Fine Pitch System and Method for Reinforcing Bond Pads in Semiconductor Devices").

In the embodiment of FIG. 2, the contact pad has an added conductive layer 205 on the pad metallization 202. This layer 205 is conformal to the surface of the chip and provides a reliable, low resistance contact to the pad metallization 202. As FIG. 2 shows, layer 205 covers not only the area of the pad 202a proper, but also the window side walls of protective layers 203 and 204 and a portion 205a of the surface surrounding the pad window. The preferred material for layer 205 is aluminum in the thickness range of about 500 to 1000 nm. There are various method of depositing layer 205. The preferred method is sputtering, since this method allows an effective cleaning of the pad surface just before the actual metal deposition (especially useful for aluminum pad metallization 202). Other deposition techniques include evaporating and plating.

The second added layer 206 in FIG. 2 has the important function to enable the transition from a conformal outline following the chip surface contours, to a "flat" outline defining a planar outer surface, which is substantially parallel to the chip surface. The second conductive layer 206 may also have to operate as a diffusion barrier if copper is used as the chip metallization 202. The second conductive layer is selected from a group consisting of nickel, vanadium, titanium, tungsten, tantalum, osmium, chromium, and aluminum, and alloys thereof.

Dependent on the choice of the metal, there are several methods of depositing layer 206:

Electroless plating. The complete process includes the following steps:

Coating the backside of the silicon IC wafer with resist using a spin-on technique. This coat will prevent accidental metal deposition on the wafer backside.

Baking the resist, typically at 110° C. for a time period of about 30 to 60 minutes.

Cleaning of the exposed bond pad metal surface using a plasma ashing process for about 2 minutes.

Cleaning by immersing the wafer, having the exposed metal of the bond pads, in a solution of sulfuric acid, nitric acids, or any other acid, for about 50 to 60 seconds.

Rinsing in overflow rinser for about 100 to 180 seconds.

Immersing the wafer in a catalytic metal chloride solution, such as palladium chloride, for about 40 to 80 seconds "activates" the metal surface, i.e., a layer of seed metal (such as palladium) is deposited onto the clean non-oxidized metal surface.

Rinsing in dump rinser for about 100 to 180 seconds.

Electroless plating of the barrier metal. If nickel is selected, plating between 150 to 180 seconds will deposit about 0.4 to 0.6 μm thick nickel.

More detail on this and closely related processes can be found in U.S. patent application Ser. No. 09/775,322, filed Feb. 1, 2001 (Stierman et al., "Structure and Method for Band Pads of Copper-Metallized Integrated Circuits"), which is herewith incorporated by reference.

Screen printing. A plurality of openings are prepared in a mask stencil so that their position mirror-images the position of the contact pads on the IC surface. The mask stencil is then aligned with the semiconductor wafer so that each mask opening aligns with its respective IC contact pad. The metal or metal alloy is liquefied and deposited through the mask openings so that it equalizes the overcoat contours of the pad window remaining from the etch step through the overcoat layers.

Support by islands of protective overcoat. Applying a modification of the U.S. patent application Ser. No. 09/458,593 cited above, the contact pads are opened so that a plurality of silicon nitride "islands" remain unetched in the window area, creating numerous silicon nitride "mesas" with narrow vias between them. In the following metal deposition step (for instance, aluminum as the first layer, nickel as the second layer), the vias are quickly filled, while metal is also deposited on top of the mesas. The overall window metal surface approaches progressively a uniformly flat configuration.

In FIG. 2, the outermost metal layer 207 has a surface suitable to form metallurgical bonds without melting. As an example, layer 207 is made of a metal selected from a group consisting of gold, palladium, platinum, silver, and alloys thereof. The bondability function of layer 207 is emphasized. The overall thickness of the bondable metal layer 207, usually a noble metal, is kept to a minimum, thus saving cost. Acceptable thicknesses range from about 0.02 to 0.1 µm; for some metals, a flash is sufficient.

Without necessarily resorting to melting solder, these surfaces are suitable for the following attaching methods to outside board surfaces, which have been prepared with appropriately bondable metal surfaces (typically gold flash on copper-metallized terminal pads):

Direct welding by metallic interdiffusion. For this bonding, the clean surfaces of the chip contact and board terminal pads are subjected to slight compression or thermo-compression at elevated temperatures and moderate pressures for a period of time on the order of 1 s.

Attachment by conductive adhesives. This preferred embodiment permits small pad sizes and fine pad pitch, since conductive adhesives do not tend to bridge.

Attachment by solder paste. Both the chip contact pads and the board terminal pads are solderable. Consequently, metallurgically strong solder connections are easily established.

It is an important feature of the present invention that the number of added conductive layers are not restricted to three. There may be only one layer, or two layers, or more than three layers added to the chip contact pads metallization. It is only required that the added conductive layer or layers have a conformal surface adjacent the chip and a planar outer surface, and that the puter surface be suitable to form metallurgical bonds, without necessarily resorting to melting of solder.

It is another important feature of the present invention that the described added conductive layers can be formed onto any number of chip contact pads. The described technique is thus applicable chips with a small number of I/O's (for example, 12 I/O's as illustrated in FIG. 3) as well as to chips with a high number of I/O's (for example, 200 or 600 I/O's). The contact pads may be shaped as a rectangle, a square or a circle with a side length of about 40 to 150 µm, preferably 90 to 100 µm. The pitch between neighboring contact pads is typically in the range from 0.4 to 0.6 mm with a separation between pads from 50 to 200 µm, for chips with high numbers of input/output terminals preferably between 50 and 75 µm. It is a technical advantage of the present invention that the pitch between neighboring contacts can be reduced to 100 µm center-to-center, which is a major improvement over solder ball contacts.

It is another important feature of the present invention that the described added conductive layers can be formed whatever the arrangement and distribution of the contact pads may be. As an example, the contact pads may be arrayed along the periphery of the active chip surface, as illustrated in FIG. 3. In another example, the contact pads may be arrayed in the center of the active chip surface. In yet another example, the contact pads may be arrayed in an arbitrary configuration across the active chip surface.

It is a technical advantage of the present invention that it permits protection of the passive surface of the chip, indicated by the layer 210 in FIG. 2. Preferably, layer 210 is an electrically non-conductive material of black color to protect the chip against disturbing influences of light or other electromagnetic radiation, of environmental degradation such as moisture and dust, and of mechanical disturbances such as scratches. Methods of fabricating layer 210 include:

Screen-printing of polymeric material, undoped or doped;
Spinning of insulating material which will harden;
Attaching tape or film;
Spraying low-viscosity material which will harden; and
Transfer molding a protective layer.

Figure 3A:
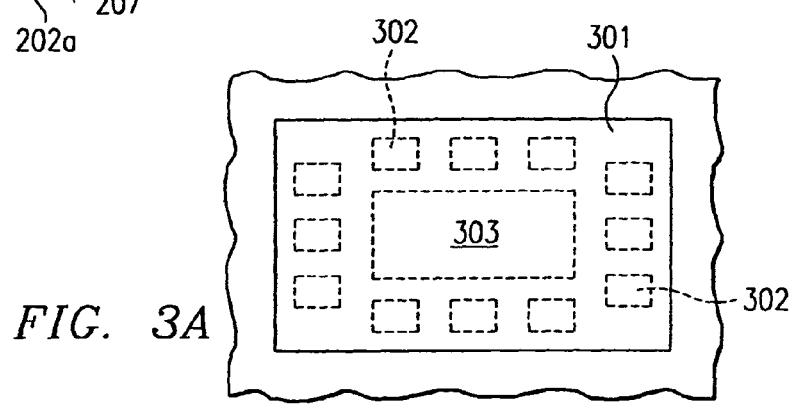
FIG. 3A is a schematic top view of the second preferred embodiment of the invention, showing the active chip surface having a plurality of metallized contact pads in a first array and a heat spreader positioned in the remaining surface area.
Figure 3B:
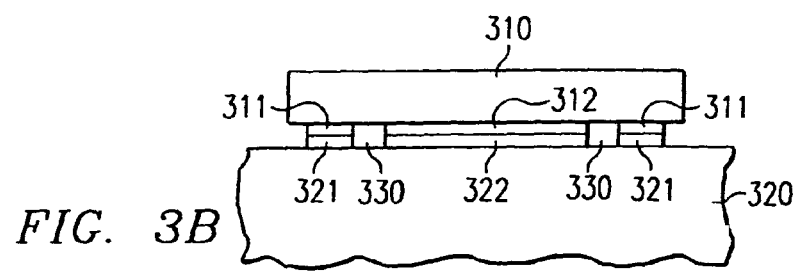
FIG. 3B is a schematic cross section of the second embodiment, having metallized contact pads and a heat spreader, attached to a printed circuit board.

FIG. 3 illustrates the second preferred embodiment of the invention in a schematic top view (FIG. 3A) of the active chip surface 301 and a schematic cross section (FIG. 3B) of the chip attached to the wiring board. In the second embodiment as illustrated in FIG. 3A, the chip contact pads 302, covered with the added conductive layers described above, are distributed such that an area portion of the active chip surface is available for attaching a thermally conductive plate 303. In the example of FIG. 3A, this area portion is the central area of the active chip surface 301. Since the plate is operable as a heat spreader, it is preferably made of a good thermal conductor (yet low cost material) such as copper and has a thickness compatible with the thickness of the added conductive pads layers (0.2 to 0.8 µm).

The plate 303 has an outer surface suitable for metallurgical bonds. Especially, the outer surface may be solderable. Preferably, the outer plate surface is a noble metal layer similar to layer 207 in FIG. 2, for instance a gold flash. The plate can then be attached to a wiring board metal pad, prefabricated in aligned position, concurrently with the attachment of the contact metal structures 302 to the board. For this attachment to the board, the same options are available, which are discussed above:

Direct welding by metallic interdiffusion;
Attachment by conductive adhesives;
Attachment by solder paste.

The schematic cross section of FIG. 3B depicts the assembled system. IC chip 310 has a plurality of metallized contact pads 311 arrayed along the chip periphery. Further, it has a heat-spreading plate 312 in the chip surface area not utilized by contact pads. The wiring board 320 has mirror-image counterparts: terminal pads 321 and thermal sink 322. The assembly establishes electrical contact between the IC chip and the board, and forms gaps 330 in the spaces between the metallized areas. The width of the gaps is approximately equal to the thickness of the added conductive layers 311 on the chip contact pads, plus any height of the aligned metallization 321 on the board. The assembly board is typically selected from a group consisting of organic materials, including FR-4, FR-5, and BT resin, with or without strengthening or thermally modulating fibers; metals; and ceramics.

Figure 4A:
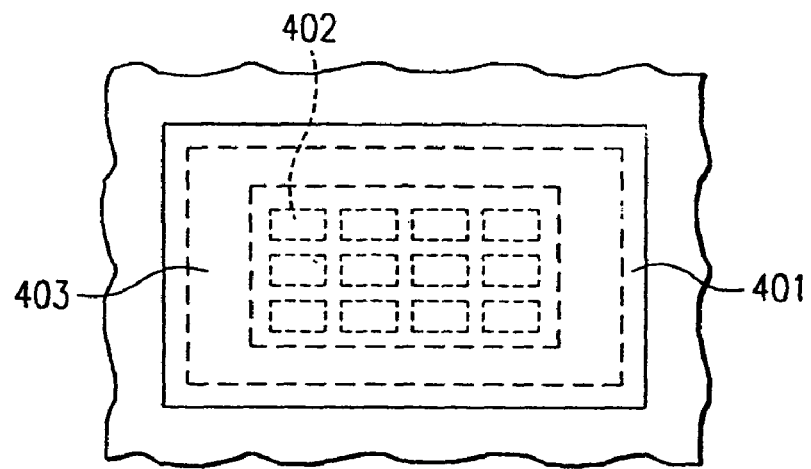
FIG. 4A is a schematic top view of the second preferred embodiment showing the active chip surface having a plurality of metallized contact pads in a second array and a heat spreader positioned in the remaining surface area.
Figure 4B:
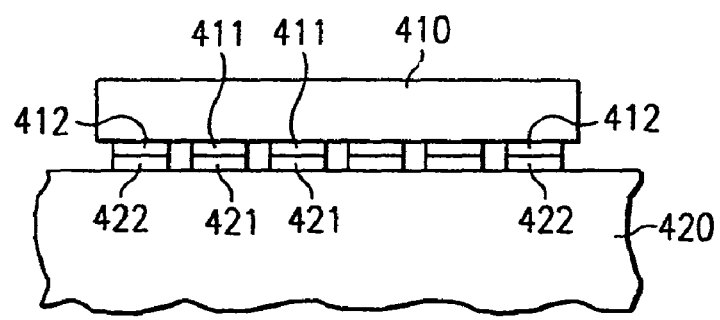
FIG. 4B is a schematic cross section of the second embodiment, having metallized contact pads and a heat spreader, attached to a printed circuit board.

As mentioned above, the contact pads may be arrayed in the center of the active chip surface. This case is depicted in FIGS. 4A and 4B, with the contact pads 402 and 411, respectively, in the center of the surface 401 of chip 410. The area portion of the active chip surface available for attaching a thermally conductive plate is the chip periphery. The heat spreader is now formed as a broad frame 403 and 412, respectively, around the contact pads. This distribution is particularly favorable for minimizing thermomechanical stress at the assembled contact pads, when the system is subjected to temperature variations and the mismatch between the coefficients of thermal expansion of IC chip and board become important. The mirror-image metallized areas on board 420 are designated 421 for the contact pads and 422 for the heat-conducting frame.

Figure 4C:
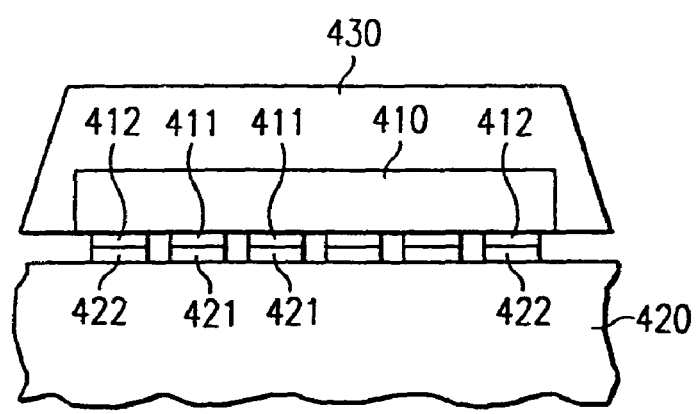
FIG. 4C is a schematic cross section of the same second embodiment as FIG. 4B, yet including a protective device encapsulation.

It is yet another important feature of the present invention that an encapsulation can be formed protecting at least the chip surface opposite to the active surface, and that the encapsulated device can be assembled on a board. The preferred encapsulation material is a molding compound, and the preferred encapsulation method the transfer molding technique. The device variation exhibiting a molded encapsulation is especially recommended when the I/C chip is thinner than the customary thickness of 275 µm. FIG. 4C shows the assembly of FIG. 4B with a device having an encapsulation 430.

Figure 5:
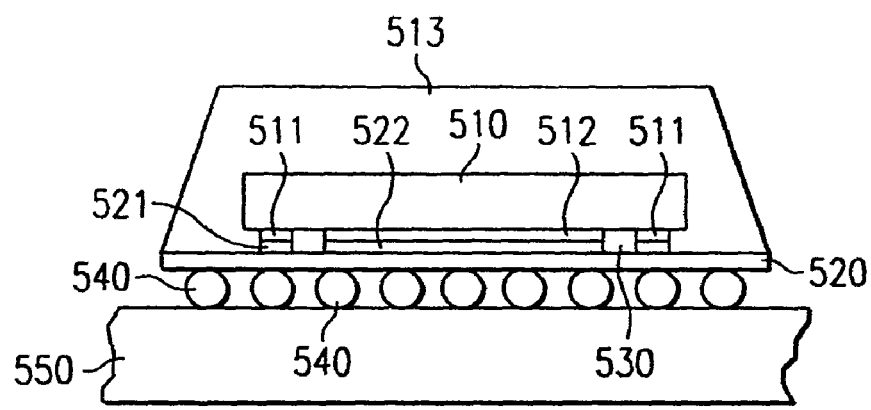
FIG. 5 is a schematic cross section of the second embodiment attached to an insulator-based substrate, then encapsulated in a molded package, and finally attached to a board using solder balls.
Figure 6:
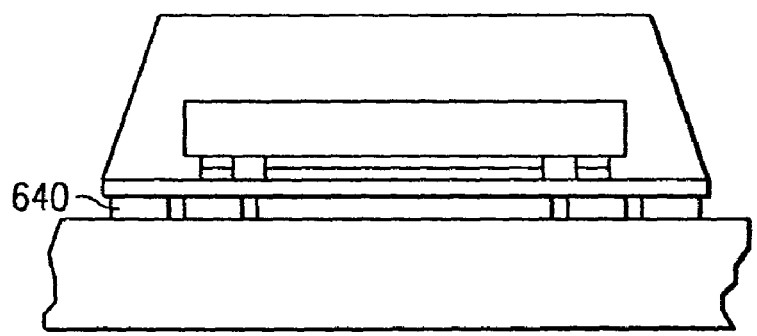
FIG. 6 is a schematic cross section of the second embodiment attached to an insulator-based substrate, then encapsulated in a molded package, and finally attached to a board using bondable metal lands.

In FIGS. 5 and 6, a molded device analogous to the embodiment in FIG. 3B is shown in an assembly on relatively thin substrates, preferably insulator-based substrates such as a polyimide film. In FIG. 5, this assembled device is then completed as a ball-grid array device having solder balls. In FIG. 6, the assembled device is completed as a land-grid array (lead-less, or no-lead) device having bondable or solderable attachment pads.

In the schematic cross section of FIG. 5, the I/C chip 510 has added conductive contact metallization 511 for the plurality of pads and a heat spreader 512 similar to FIG. 3B. Molding compound 513 encapsulates the device. The film-like substrate 520 has mirror-image terminals 521 for the contact pads 511 and heat sink 522 for heat spreader 511. Molding compound 513 encapsulates the passive surface of the chip, attaches strongly to substrate 520, and fills the gaps 530. Using solder balls 540, the device is attached to printed circuit board 550.

In the schematic cross section of FIG. 6, bondable or solderable lands replace the solder balls 540 of FIG. 5. In other respects, the structure of the device and the assembly onto the board are analogous to FIG. 5.

Figure 7:
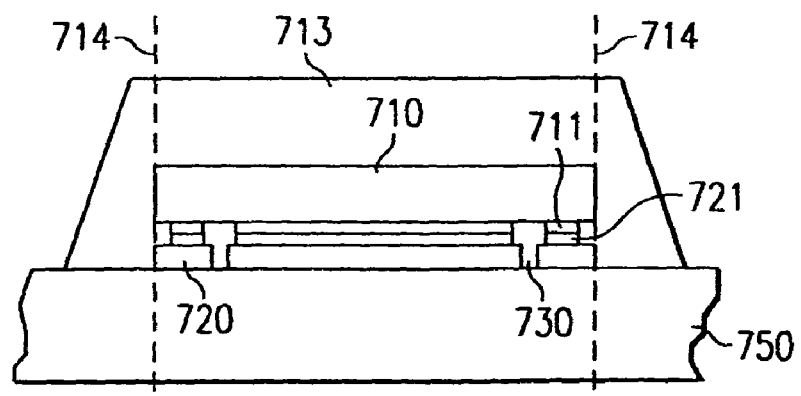
FIG. 7 is a schematic cross section of the second embodiment attached to a sheet-like metal, then encapsulated, and finally attached to a board using the bondable outer surface of the metal sheet.

In the embodiment of FIG. 7, the contact metallization 711 of chip 710 is attached to the counterparts 721 on a "leadframe"-like, relatively thick sheet of metal 720. This subassembly is encapsulated in molding compound 713, which also fill the gaps 730. The outer surface of the sheet-like metal 721 is bondable or solderable. It is attached to printed circuit board 750. It should be mentioned that the embodiment of FIG. 7 lends itself to fabricating a chip-size package. Instead of encapsulating individual chips, the whole wafer is encapsulated by molding compound. Subsequently, the devices are singulated, preferably by sawing, along lines 714, which are determined by the outline of chip 710.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the mutual arrangement of the contact pads and the heat spreader may be designed in a number of different configurations. As another example, the selection of the added metal layers to the contact pads can be varied to be best suitable for the assembly technique selected for board attachment.

It is therefore intended that the appended claims encompass any such modifications or embodiments.

We claim:

1. A method for fabricating a semiconductor assembly comprising the steps of:
   providing a semiconductor chip having a planar active surface including an integrated circuit, said integrated circuit having a metallization pattern including at least one contact pad at said planar active surface;
   providing a protective overcoat over said planar active surface, said protective overcoat including windows exposing said at least one contact pad, said window having sidewalls;
   providing an added conductive region having at least one conductive layer on said metallization pattern covering and conformal to said at least one contact pad, said sidewalls of said window and a portion of said protective overcoat surrounding said window, said added conductive region having a planar outer surface, said outer surface of said added conductive region suitable to form metallurgical bonds without melting;
   providing a assembly board having at least one planar, metallurgically bondable terminal pad in a distribution aligned with the distribution of said at least one contact pad;
   aligning said added conductive region and said at least one terminal pad so that said at least one contact pad is connected to a corresponding terminal pad; and
   metallurgically bonding said added conductive region and said at least one terminal pad without melting said outer surface of said added conductive region.

2. The method according to claim 1 wherein said step of providing an added conductive region is selected from a group consisting at least in part of sputtering, evaporating, and plating.

3. The method of claim 1 wherein said step of fabricating a planar outer surface of said added conductive region comprises the step of depositing a second of at least one added conductive layer by electroless plating.

4. The method according to claim 1 wherein said step of fabricating a planar outer surface of said added conductive region comprises the step of depositing a second of at least one added conductive layer by screen printing.

5. The method according to claim 1 wherein said step of fabricating a planar outer surface of said added conductive region comprises the step of depositing a second of at least one added conductive layer by using the method of support by islands of protective overcoat.

6. The method according to claim 1 wherein said bonding comprises one of the following assembly techniques:
   direct welding by metallic interdiffusion;
   attaching including solder paste;
   attaching including a conductive adhesive.

* * * * *